(12) United States Patent  
Collins et al.

(10) Patent No.: US 7,739,636 B2
(45) Date of Patent: *Jun. 15, 2010

(54) DESIGN STRUCTURE INCORPORATING SEMICONDUCTOR DEVICE STRUCTURES THAT SHIELD A BOND PAD FROM ELECTRICAL NOISE

(75) Inventors: David S. Collins, Williston, VT (US); Mete Erturk, Alburgh, VT (US); Edward J. Gordon, Bristol, VT (US); Robert Groves, Highland, NY (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 170 days.

This patent is subject to a terminal disclaimer.

(21) Appl. No.: 11/877,155

(22) Filed: Oct. 23, 2007

(65) Prior Publication Data

US 2009/0106713 A1 Apr. 23, 2009

(51) Int. Cl.
*G06F 17/50* (2006.01)
*G06F 9/45* (2006.01)
(52) U.S. Cl. ............... 716/5; 716/1; 716/6; 716/8; 716/9; 716/10; 716/11; 716/12; 716/13; 716/14; 716/15; 716/18; 257/1; 257/533; 438/141; 438/142; 438/381
(58) Field of Classification Search ............... 716/1, 716/5–6, 8–15, 18; 257/1, 533; 438/141–142, 438/381

See application file for complete search history.

(56) References Cited

U.S. PATENT DOCUMENTS

| 5,514,892 | A | | 5/1996 | Countryman et al. |
| 5,923,076 | A | * | 7/1999 | Campardo et al. .......... 257/533 |
| 6,941,535 | B2 | * | 9/2005 | Sekido .......................... 716/8 |
| 2005/0087807 | A1 | | 4/2005 | Righter |
| 2006/0154469 | A1 | | 7/2006 | Hess et al. |

OTHER PUBLICATIONS

David S. Collins, et al, Semiconductor Device Structures and Methods for Shielding a Bond Pad from Electrical Noise, U.S. Appl. No. 11/778,902, filed Jul. 17, 2007.
Matthew E. Gordon, USPTO, final Office Action issued in related U.S. Appl. No. 11/778,902 dated Oct. 30, 2009.
Matthew E. Gordon, USPTO, Office Action issued in related U.S. Appl. No. 11/778,902 dated Apr. 3, 2009.

* cited by examiner

*Primary Examiner*—Jack Chiang
*Assistant Examiner*—Nghia M Doan
(74) *Attorney, Agent, or Firm*—Wood, Herron & Evans, LLP

(57) ABSTRACT

Design structure embodied in a machine readable medium for designing, manufacturing, or testing a design. The design structure includes active circuitry on a substrate, a bond pad carried by the substrate, and a shielding structure disposed between the substrate and the bond pad. The shielding structure includes a plurality of electrically characterized devices configured to reduce noise transmission from the active circuitry to the bond pad.

7 Claims, 5 Drawing Sheets

DESIGN STRUCTURE INCORPORATING SEMICONDUCTOR DEVICE STRUCTURES THAT SHIELD A BOND PAD FROM ELECTRICAL NOISE

CROSS-REFERENCE TO RELATED APPLICATIONS

This application is related to application Ser. No. 11/778,902, filed Jul. 17, 2007, which is hereby incorporated by reference herein in its entirety.

FIELD OF THE INVENTION

The invention relates generally to integrated circuit fabrication and, in particular, to design structures for integrated circuits in which electrically characterized devices are placed beneath a bond pad.

BACKGROUND OF THE INVENTION

Bond pads are used to connect packaged integrated circuits on a semiconductor chip with external circuitry on a printed circuit board or lead frame. The connections with the external circuitry supply power and communicate signals to the active circuitry of an integrated circuit. For integrated circuits that operate high frequencies, such as integrated circuits constructed for radiofrequency (RF) applications, a ground plane is required to reduce the coupling of noise from the active circuitry on the chip to the bond pad. A typical ground plane comprises a layer of doped polysilicon or metal strips arranged between the bond pad and the active circuitry and is wired at a direct current circuit node/potential different from the bond pad itself.

Active circuitry is typically not positioned within the chip area beneath the bond pad and ground plane. Consequently, the use of ground planes for bond pads may waste large areas of the chip that could otherwise be utilized for active circuitry. Fabrication techniques have been developed that allow bond pads to be disposed within the perimeter of the active circuit area so that the bond pad overlies active circuitry. However, a circuit designer is forced to model the bond pad to reflect multiple different variations and permutations for active and passive devices in the chip area beneath the bond pad.

High-frequency and, in particular, radiofrequency integrated circuits include a large number of switches capable of rapidly changing state. The high switching rates may induce transient current surges in the ground and supply lines, which cause variations in the supply voltage. To minimize these variations and maintain proper circuit operation, decoupling capacitors are used to filter the noise that may be present in the ground and supply lines. Decoupling capacitors are connected between the supply voltage and ground in parallel with the supplied integrated circuit. The parallel capacitance decouples the supply voltage from disturbances induced by high speed switching, which allows the supply voltage to remain at the intended level.

To optimize their effectiveness, circuit designers generally attempt to place decoupling capacitors as close as practical to the load represented by the active circuitry on the chip. Consequently, the most effective solution for noise filtering is to fabricate decoupling capacitors directly on the chip itself. Unfortunately, on-chip decoupling capacitors may utilize as much as thirty percent of the active circuit area on the chip, which significantly reduces the profit margin for monolithic integrated circuits.

Consequently, design structures are needed that incorporate a shielding structure of electrically characterized devices for shielding the bond pad from noise generated by active circuitry underlying the bond pad.

SUMMARY OF THE INVENTION

Embodiments of the invention are generally directed to semiconductor device structures and methods that place electrically characterized devices, such as decoupling capacitors, FETs, diodes, etc., in a pre-determined arrangement under a bond pad. The pre-determined arrangement of the electrically characterized devices provides for a consistent high frequency environment under the bond pad that simplifies modeling of the bond pad by a circuit designer. The electrically characterized devices are available to optionally be coupled to other portions of the integrated circuit.

In one specific embodiment, the semiconductor device structure comprises a shielding structure disposed between active circuitry of a substrate and a bond pad. The shielding structure includes electrically characterized devices configured to reduce noise transmission from the active circuitry to the bond pad.

In one specific embodiment, the method comprises fabricating a shielding structure including a plurality of electrically characterized devices disposed between a substrate and a bond pad to provide a ground plane. The method further comprises selectively activating one or more of the plurality of electrically characterized devices in the shielding structure.

In another embodiment, a design structure embodied in a machine readable medium is provided for designing, manufacturing, or testing a design. The design structure includes active circuitry on a substrate, a bond pad carried by the substrate, and a shielding structure disposed between the substrate and the bond pad. The shielding structure of the design structure includes a plurality of electrically characterized devices configured to reduce noise transmission from the active circuitry to the bond pad.

The design structure may comprise a netlist, which describes the design. The design structure may reside on storage medium as a data format used for the exchange of layout data of integrated circuits. The design structure may include at least one of test data files, characterization data, verification data, or design specifications.

DETAILED DESCRIPTION

Figure 1:
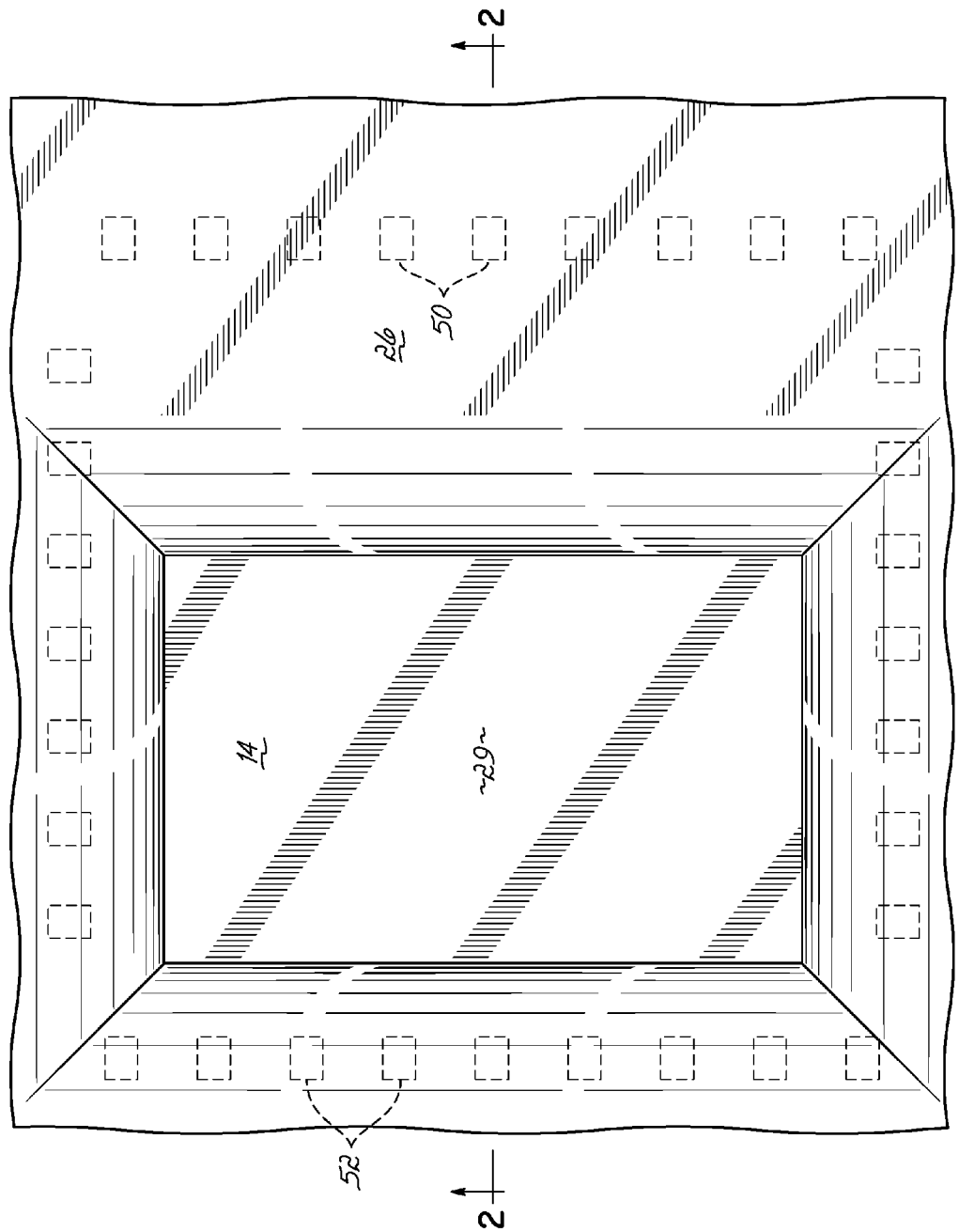
FIG. 1 is a top view of a portion of a substrate including a shielding structure in accordance with an embodiment of the invention that is disposed between an overlying bond pad and an underlying substrate.
Figure 1A:
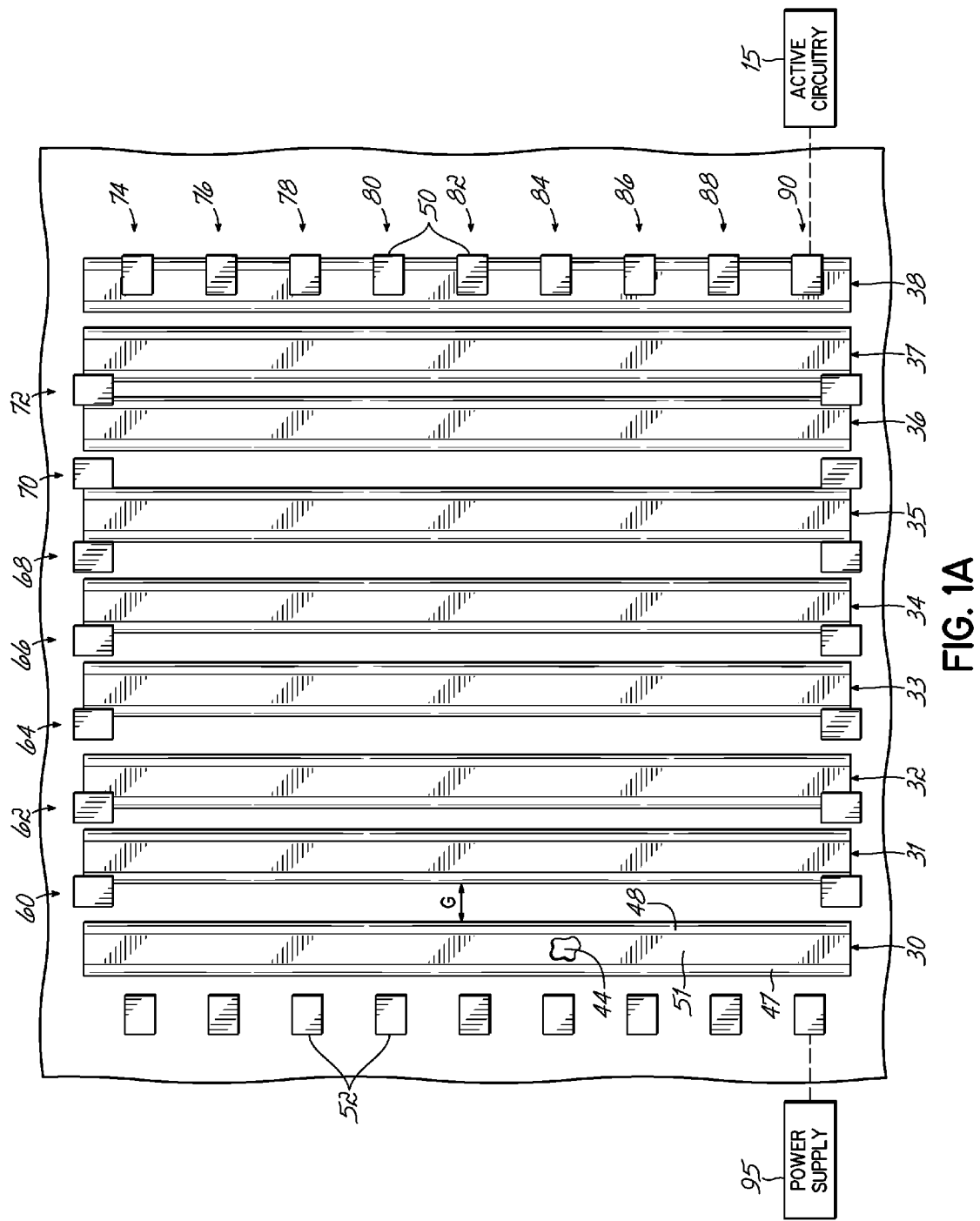
FIG. 1A is a top view similar to FIG. 1 in which portions of the bond pad and multi-level interconnect structure are omitted for clarity of description.
Figure 2:
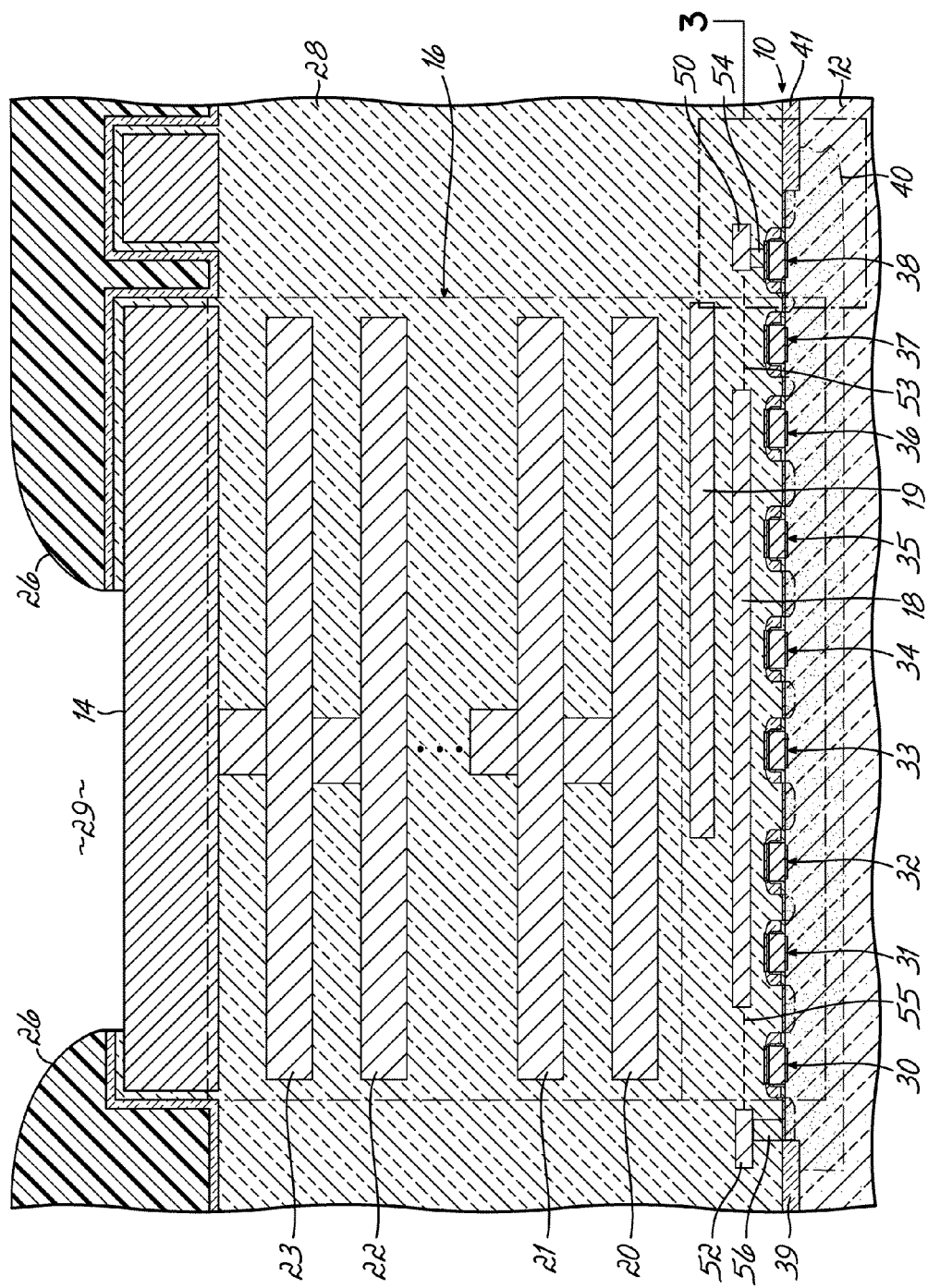
FIG. 2 is a cross-sectional view taken generally along line 2-2 in FIG. 1.

With reference to FIGS. 1 and 2, a shielding structure, generally indicated by reference numeral 10, is carried on a substrate 12 and generally underlies a bond pad 14. Substrate 12 includes an integrated circuit having active circuitry 15 in the form of various circuits and/or devices (not shown) formed thereon and/or therein and with features that are to be contacted for operating the integrated circuit. The shielding structure 10 is located between the bond pad 14 and the active circuitry 15 on the substrate 12. Substrate 12 may be a semiconductor wafer composed of a semiconductor material including, but not limited to, silicon (Si), silicon germanium (SiGe), a silicon-on-insulator (SOI) layer, and other like Si-containing semiconductor materials.

A multi-level interconnect structure, generally indicated by reference numeral 16, includes a plurality of metallization levels 18-23 disposed between the bond pad 14 and the substrate 12. Each of the metallization levels 18-23 includes conductive lines and conductive plugs that supply vertical interconnections among the conductive lines in different metallization levels 18-23. The metallization levels 18-23 are embedded in layers 28 of dielectric material that electrically isolate the levels 18-23 from each other and metallization level 23 from the bond pad 14. The interconnect structure 16 may include additional metallization levels (not shown) between metallization levels 21, 22. The metallization levels 18-23 of the interconnect structure 16 operate to distribute signals among the active circuitry 15 on the substrate 12. Ordinarily, the first metallization level 18, which is closest to the substrate 12, primarily interconnects the active circuitry 15 of the substrate 12 and may provide circuit-to-circuit connections. The upper levels, such as metallization levels 19-23, complete the circuit-to-circuit connections and make contact with bond pad 14 and other bond pads (not shown).

The bond pad 14 and metallization levels 18-23 are fabricated by conventional back end of line (BEOL) processes and from conductor materials familiar to a person having ordinary skill in the art. For example, conventional damascene processes may be used to fabricate at least the conductive lines of metallization levels 18-22 with a copper metallurgy and conventional subtractive etching processes may be used to fabricate the bond pad 14 and at least the conductive lines of metallization level 23 with an aluminum metallurgy. The bond pad 14 and metallization levels 18-23 may include additional components (not shown) like liner layers, such as a bilayer of TaN/Ta or a bilayer of TiN/Ti, situated between the dielectric material and the conductive features that serve as a diffusion barrier to isolate the conductor and dielectric materials.

A passivation layer 26 of an organic polymer, such as polyimide, includes an opening 29 that partially exposes the bond pad 14 for wire bonding. Optionally, one of the metallization levels 18-23 may comprise a metal shield that provides noise shielding effective to decrease signal coupling from the active circuitry 15 in substrate 12 to the bond pad 14 and also effective to decrease signal coupling with the other metallization levels 18-23.

With reference to FIGS. 1, 1A, 2, and 3 and in accordance with an embodiment of the invention, the shielding structure 10 includes a plurality of capacitors, such as the representative bank of planar capacitors 30-38 laterally bound between dielectric regions 39, 41 defined in the substrate 12 outside the perimeter of the shielding structure 10. Each of the capacitors 30-38 is formed in a well 40 defined, for example, by partially masking the substrate 12 and implanting ions into unmasked regions of the substrate 12. The substrate 12 and well 40 are doped with impurities characterized by opposite conductivity types. For example, the capacitors 30-38 may be n-well capacitors if the substrate 12 contains p-type semiconductor material and the well 40 is an n-well defined in the p-type semiconductor material of the substrate 12. Alternatively, the capacitors 30-38 may be p-well capacitors if the well 40 is a p-well and the substrate 12 contains n-type semiconductor material.

Figure 3:
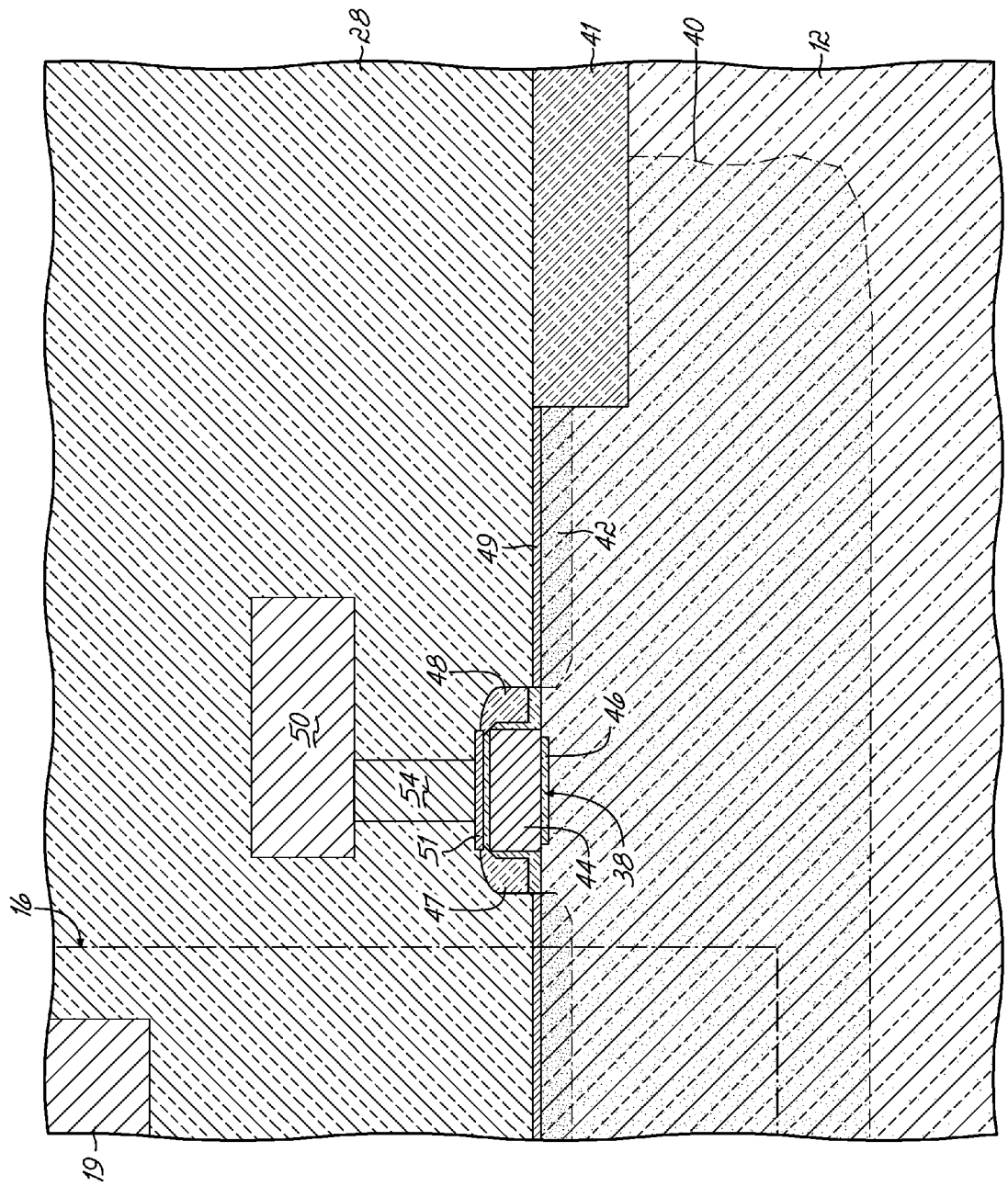
FIG. 3 is an enlarged detailed view of a portion of FIG. 2.

As best shown for capacitor 38 in FIG. 3, each of the capacitors 30-38 includes a contact region 42, a gate 44, and a gate dielectric 46 electrically isolating the gate 44 from the well 40. The contact region 42 is formed as a localized volume of semiconductor material inside the well 40 that is heavily doped with an impurity having the same conductivity type as the well 40. Self-aligned silicide layers 49, 51 are formed by a conventional silicidation process on the contact region 42 and gate 44, respectively. The gate 44 is flanked by dielectric spacers 47, 48. Capacitor 38 may include additional structures, such as doped halo and extension regions, formed by ion implantation techniques understood by a person having ordinary skill in the art. The plates or electrodes of the capacitor 38 are respectively defined by the insulated gate 44 and the well 40 with the gate dielectric 46 serving as a capacitor dielectric. The gates 44 define a plurality of parallel strips containing a conductive material and are arranged with a pitch such that adjacent strips are separated by a gap, G, as apparent in FIG. 1A.

The gate 44 may be formed using conventional techniques understood by a person having ordinary skill in the art from doped polycrystalline silicon (polysilicon), a metal silicide, a metal, or any combination of these materials. The dielectric material constituting the gate dielectric 46 may be silicon dioxide, TEOS, silicon nitride, or any combination of these materials, and may be formed using conventional techniques. Alternatively, the gate dielectric 46 may contain other insulating materials having a suitably high dielectric constant as understood by a person having ordinary skill in the art.

A plurality of interconnection tabs 50, 52, which are included in the conductive features in the metallization level 18 proximate to the substrate 12, are peripherally arranged about the perimeter of the shielding structure 10. Each of the interconnection tabs 50 is physically and electrically coupled with the gate 44 of a capacitor in one of the columns of capacitors in the shielding structure 10. As shown in FIG. 2, the gate 44 and intervening silicide layer 49 of capacitor 38 in the row of capacitors 30-38 is coupled by a plug 54 with one of the interconnection tabs 50. Similarly, each of the interconnection tabs 52 is physically and electrically coupled with the contact region 42 of one of the rows of capacitors in the shielding structure 10. As shown in FIGS. 2 and 3, the contact region 42 and intervening silicide layer 49 of each individual capacitor 30 in the row of capacitors 30-38 is coupled by a plug 56 with one of the interconnection tabs 52. The interconnection tabs 50, 52 may be used to optionally couple the capacitors 30-38 to other portions of the integrated circuit.

The capacitors 30-38 represent electrically characterized devices in one bank or row 82 of a matrix or array of substantially identical capacitors in the shielding structure 10. Each of the capacitors 30-38 is located in one of the columns 60-72 of the matrix. The shielding structure 10 includes additional rows 74-90 of electrically characterized devices in the form of capacitors (not shown), which are each substantially identical to capacitors 30-38 occupying in row 82. The capacitor columns 60-72 and capacitor rows 74-90 have an arrangement characteristic of decoupling capacitors used to filter line noise that may be present between operating supplies, such as power and ground. Alternative arrangements for the capacitors 30-38, such as an arrangement that does not have rigidly defined rows and columns, would be apparent to a person having ordinary skill in the art. In an alternative embodiment, the well 40 may be partitioned using shallow or deep trench isolation regions or p-n junction isolation regions (not shown)

so that different interconnection tabs 50 can be used to independently bias different portions of the well 40.

The gates 44 of the capacitors 30-38 and other capacitors (not shown) in the shielding structure 10 operate as a ground plane that enhances noise isolation from active circuitry 15 carried on the substrate 12 to the bond pad 14. In addition, the capacitors 30-38 of the shielding structure 10 may also function as on-chip decoupling capacitors disposed in a circuit connecting the active circuitry 15 on the substrate 12 with a power supply 95. Consequently, the shielding structure 10 may serve a dual function that eliminates or reduces the need for using additional regions on the substrate 12 to locate decoupling capacitors. In this regard, the gate 44 of each of the capacitors 30-38, and other capacitors (not shown), in the shielding structure 10 concurrently act as an anode of the decoupling capacitor structure.

Locating the interconnection tabs 50, 52 about the outer perimeter of the shielding structure 10 permits a circuit designer to tap or tie into as many of the capacitors 30-38 in the matrix as necessary for each, or any part, of the chip design for activating a selected number of the capacitors 30-38. The shielding structure 10 is defined into numerous banks of arrays or devices, such as capacitors 30-38, that circuit designers can simply link up to via an interconnect region defined by interconnection tabs 50, 52 around the outer perimeter for the bond pad 14 and at a lower metallization level 18. Because the shielding structure 10 and metallization levels 18-23 are predefined and optimized under the bond pad 14, the bond pad 14 can be very well modeled by circuit designers because the ground plane is likewise predefined and invariable.

To establish a selected capacitance, a circuit designer simply needs to selectively strap or connect to a selected number of banks or arrays of capacitors 30-38 to selectively activate these connected devices. Alternatively, the circuit designer may strap or connect to a selected combination of banks or arrays of capacitors 30-38 to provide the selected capacitance. Consequently, only a single model of bond pad 14 is needed by the circuit designer for a ground plane offering, while simultaneously providing for unlimited usage of the capacitors 30-38 by selection of the electrical connections 53, 55 (FIG. 2) made using the interconnection tabs 50, 52. The process for selecting the capacitance may be automated so that the circuit designer selects a required capacitance and the cell implements the interconnecting of the banks/arrays of the shielding structure 10 on the outer perimeter of the bond pad 14.

In alternative embodiments of the invention, the capacitors 30-38 may have a different type of construction characteristic of electrically characterized devices recognized by a person having ordinary skill in the art. By way of example and not limitation, the capacitors 30-38 in the matrix may comprise trench capacitors, rather than the planar capacitors of the representative embodiment. This configuration of trench capacitors may exhibit enhanced noise isolation and provide a larger capacitor density in comparison with planar capacitors. As other examples, the capacitors 30-38 may also be replaced with field effect transistors or diodes. In each instance, the electrically characterized devices include substantially parallel lines of conductive material arranged with intervening gaps between adjacent lines that effectively define a ground plane operating to mitigate the transfer of electrical noise from the active circuitry 15 on the substrate 12 to the bond pad 14.

Figure 4:
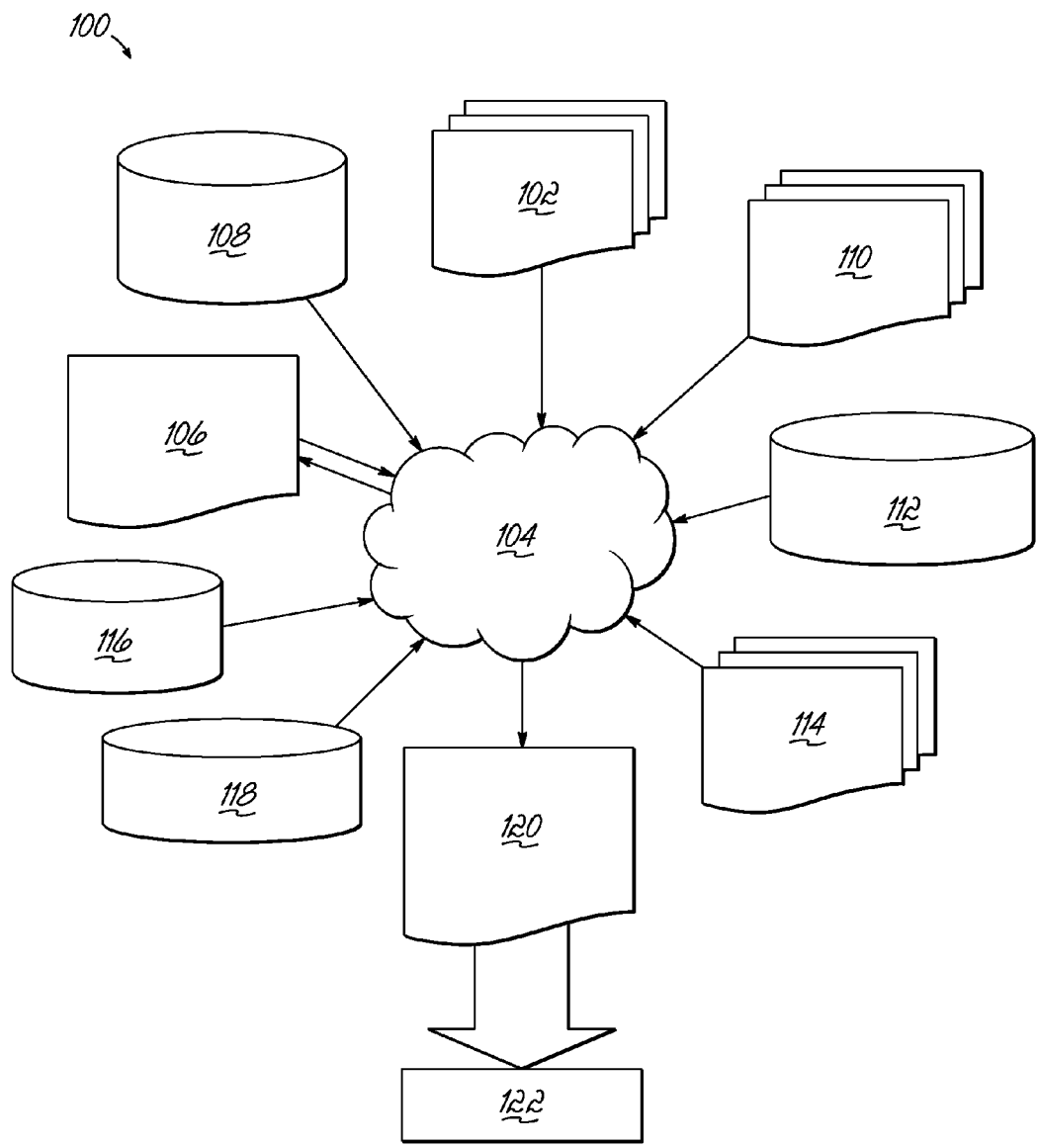
FIG. 4 is a flow diagram of a design process used in semiconductor design, manufacturing, and/or test.

FIG. 4 shows a block diagram of an example design flow 100. Design flow 100 may vary depending on the type of integrated circuit (IC) being designed. For example, a design flow 100 for building an application specific IC (ASIC) may differ from a design flow 100 for designing a standard component. Design structure 102 is preferably an input to a design process 104 and may come from an IP provider, a core developer, or other design company, or may be generated by the operator of the design flow, or from other sources. Design structure 102 comprises a circuit incorporating the shielding structure 10 in the form of schematics or HDL, a hardware-description language (e.g., Verilog, VHDL, C, etc.). Design structure 102 may be contained on one or more machine readable medium. For example, design structure 102 may be a text file or a graphical representation of the circuit. Design process 104 preferably synthesizes (or translates) the circuit into a netlist 106, where netlist 106 is, for example, a list of wires, transistors, logic gates, control circuits, I/O, models, etc. that describes the connections to other elements and circuits in an integrated circuit design and recorded on at least one of machine readable medium. This may be an iterative process in which netlist 106 is resynthesized one or more times depending on design specifications and parameters for the circuit.

Design process 104 may include using a variety of inputs; for example, inputs from library elements 108 which may house a set of commonly used elements, circuits, and devices, including models, layouts, and symbolic representations, for a given manufacturing technology (e.g., different technology nodes, 32 nm, 45 nm, 90 nm, etc.), design specifications 110, characterization data 112, verification data 114, design rules 116, and test data files 118 (which may include test patterns and other testing information). Design process 104 may further include, for example, standard circuit design processes such as timing analysis, verification, design rule checking, place and route operations, etc. One of ordinary skill in the art of integrated circuit design can appreciate the extent of possible electronic design automation tools and applications used in design process 104 without deviating from the scope and spirit of the invention. The design structure of the invention is not limited to any specific design flow.

Design process 104 preferably translates an embodiment of the invention as shown in FIGS. 1, 1A, 2, and 3, along with any additional integrated circuit design or data (if applicable), into a second design structure 120. Design structure 120 resides on a storage medium in a data format used for the exchange of layout data of integrated circuits (e.g. information stored in a GDSII (GDS2), GL1, OASIS, or any other suitable format for storing such design structures). Design structure 120 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 1A, 2, and 3. Design structure 120 may then proceed to a stage 122 where, for example, design structure 120: proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the invention. It is also understood that features of the embodiments of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A design structure embodied in a readable storage device for designing, manufacturing, or testing a design, the design structure comprising:
   a substrate;
   active circuitry on the substrate;
   a bond pad carried by the substrate; and
   a shielding structure disposed between the substrate and the bond pad, the shielding structure including a plurality of capacitors configured to reduce noise transmission from the active circuitry to the bond pad, the plurality of capacitors arranged in a plurality of rows and a plurality of columns, each of the plurality of capacitors having a gate, and each of the plurality of rows having a contact region; and
   a metallization level proximate to the substrate and disposed between the shielding structure and the bond pad, the metallization level including a plurality of first interconnection tabs arranged outside of an outer perimeter of the bond pad and a plurality of second interconnection tabs arranged outside of the outer perimeter of the bond pad, the first interconnection tabs and the second interconnection tabs arranged outside of the outer perimeter of the shielding structure, each of the plurality of first interconnection tabs physically and electrically coupled with the gate of the capacitor in one of the columns of capacitors, and each of the plurality of second interconnection tabs physically and electrically coupled with the contact region of one of the plurality of rows of the plurality of capacitors.

2. The design structure of claim 1 wherein the plurality of first interconnection tabs and the plurality of second interconnection tabs electrically couple a power supply through the one or more of the plurality of capacitors with the active circuitry on the substrate.

3. The design structure of claim 1 wherein the plurality of capacitors are planar capacitors.

4. The design structure of claim 1 wherein the design structure comprises a netlist, which describes the design.

5. The design structure of claim 1 wherein the design structure resides on storage device as a data format used for the exchange of layout data of integrated circuits.

6. The design structure of claim 1 wherein the design structure includes at least one of test data files, characterization data, verification data, or design specifications.

7. The design structure of claim 1 wherein each of the plurality first interconnection tabs is electrically coupled with the gate of a respective one of the capacitors and each of the plurality of second interconnection tabs is electrically coupled with a power supply such that the plurality first interconnection tabs and the plurality of second interconnection tabs cooperate to electrically couple the power supply with the active circuitry.

* * * * *